United States Patent
Garing et al.

(10) Patent No.: US 12,087,728 B2
(45) Date of Patent: *Sep. 10, 2024

(54) SYSTEMS AND METHODS RELATED TO WIRE BOND CLEANING AND WIRE BONDING RECOVERY

(71) Applicant: SKYWORKS SOLUTIONS, INC., Irvine, CA (US)

(72) Inventors: Aldrin Quinones Garing, Mexicali (MX); Miguel Camargo Soto, Mexicali (MX)

(73) Assignee: Skyworks Solutions, Inc., Irvine, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 17/712,963

(22) Filed: Apr. 4, 2022

(65) Prior Publication Data
US 2022/0336413 A1    Oct. 20, 2022

Related U.S. Application Data

(63) Continuation of application No. 15/294,551, filed on Oct. 14, 2016, now Pat. No. 11,302,669.

(60) Provisional application No. 62/250,777, filed on Nov. 4, 2015, provisional application No. 62/241,884, filed on Oct. 15, 2015.

(51) Int. Cl.
*H01L 23/00* (2006.01)
*H01L 21/02* (2006.01)
*H01L 21/48* (2006.01)

(52) U.S. Cl.
CPC ........ *H01L 24/98* (2013.01); *H01L 21/02068* (2013.01); *H01L 21/4835* (2013.01); *H01L 24/799* (2013.01); *H01L 24/85* (2013.01)

(58) Field of Classification Search
CPC .......... H01L 21/02068; H01L 21/4835; H01L 24/05; H01L 24/48; H01L 24/49; H01L 24/78; H01L 24/799; H01L 24/85; H01L 24/98; H01L 2224/7801; H01L 2224/48091; H01L 2224/49113; H01L 2224/05554; H01L 2224/48465; H01L 2224/78301
See application file for complete search history.

(56) References Cited

U.S. PATENT DOCUMENTS

| | | |
|---|---|---|
| 3,693,158 A | 9/1972 | Uthe |
| 4,824,005 A | 4/1989 | Smith |
| 4,998,664 A | 3/1991 | Gibson et al. |

(Continued)

FOREIGN PATENT DOCUMENTS

WO    2012148967    11/2012

OTHER PUBLICATIONS

International Search Report and Written Opinion dated Feb. 17, 2017 for PCT/US2016/057215.

*Primary Examiner* — Andres Munoz
(74) *Attorney, Agent, or Firm* — Chang & Hale LLP

(57) ABSTRACT

Methods, systems and devices are disclosed for performing a semiconductor processing operation. In some embodiments this includes configuring a wire bonding machine to perform customized movements with a capillary tool of the wire bonding machine, etching bulk contaminants over one or more locations of a semiconductor device with the capillary tool, and applying plasma to the semiconductor device to remove residual contaminants.

20 Claims, 7 Drawing Sheets

(56) References Cited

U.S. PATENT DOCUMENTS

| | | | |
|---|---|---|---|
| 5,205,463 A | 4/1993 | Holdgrafer et al. | |
| 5,676,856 A * | 10/1997 | Haji | B23K 20/004 |
| | | | 219/56.22 |
| 6,230,569 B1 | 5/2001 | Ball | |
| 6,444,943 B2 | 9/2002 | Barnett | |
| 6,813,828 B2 | 11/2004 | Dlugokecki et al. | |
| 6,884,663 B2 | 4/2005 | Dlugokecki et al. | |
| 6,943,062 B2 | 9/2005 | Chen et al. | |
| 7,326,640 B2 | 2/2008 | Aoh et al. | |
| 8,919,631 B2 | 12/2014 | Wong et al. | |
| 9,093,515 B2 | 7/2015 | Uehling et al. | |
| 9,103,758 B1 | 8/2015 | Frisch et al. | |
| 9,640,512 B2 | 5/2017 | Song et al. | |
| 11,302,669 B2 * | 4/2022 | Garing | H01L 24/78 |
| 2001/0037997 A1 * | 11/2001 | Barnett | B23K 10/02 |
| | | | 219/121.48 |
| 2003/0126741 A1 | 7/2003 | Dlugokecki et al. | |
| 2003/0127423 A1 | 7/2003 | Dlugokecki et al. | |
| 2005/0081824 A1 | 4/2005 | Chen et al. | |
| 2005/0133566 A1 | 6/2005 | Variyam | |
| 2005/0184133 A1 | 8/2005 | Clauberg et al. | |
| 2006/0219754 A1 * | 10/2006 | Clauberg | B23K 20/24 |
| | | | 228/8 |
| 2007/0000878 A1 * | 1/2007 | Fujita | H01L 24/85 |
| | | | 219/121.11 |
| 2007/0015352 A1 | 1/2007 | Aoh et al. | |
| 2007/0246064 A1 | 10/2007 | Jackson | |
| 2008/0009129 A1 | 1/2008 | Subido et al. | |
| 2008/0023525 A1 * | 1/2008 | Maeda | H01L 24/81 |
| | | | 228/18 |
| 2011/0183113 A1 | 7/2011 | Sakaguchi | |
| 2011/0278349 A1 | 11/2011 | Tei et al. | |
| 2013/0240605 A1 * | 9/2013 | Wong | B23K 20/10 |
| | | | 228/1.1 |
| 2015/0021376 A1 | 1/2015 | Uehling et al. | |
| 2015/0107620 A1 | 4/2015 | Wu et al. | |
| 2015/0145148 A1 | 5/2015 | Tran et al. | |
| 2015/0200143 A1 | 7/2015 | Gillotti | |
| 2017/0110437 A1 | 4/2017 | Garing et al. | |

* cited by examiner

SYSTEMS AND METHODS RELATED TO WIRE BOND CLEANING AND WIRE BONDING RECOVERY

CROSS-REFERENCE TO RELATED APPLICATION(S)

This application is a continuation of U.S. patent application Ser. No. 15/294,551, filed Oct. 14, 2016, entitled "WIRE BOND CLEANING METHOD AND WIRE BONDING RECOVERY PROCESS," which claims priority to U.S. Provisional Application No. 62/241,884, filed Oct. 15, 2015, and entitled "WIRE BOND CLEANING METHOD AND WIRE BONDING RECOVERY PROCESS," and U.S. Provisional Application No. 62/250,777, filed Nov. 4, 2015, and entitled "WIRE BOND CLEANING METHOD AND WIRE BONDING RECOVERY PROCESS," the disclosure of each of which is hereby expressly incorporated by reference herein in its entirety.

BACKGROUND

Field

The present disclosure relates to wire bonding and packaging techniques for semiconductor devices.

Description of the Related Art

Various issues and conditions contribute to non-functional semiconductor parts being scrapped for a given build. In some cases, parts are scrapped due to packaging or bonding issues on otherwise functional semiconductor devices. However, a portion of the scrapped semiconductor devices are salvageable, if they can be cleaned and re-packaged.

SUMMARY

In accordance with some implementations, the present disclosure relates to a method for performing a semiconductor processing operation. The method includes configuring a wire bonding machine to perform customized movements with a capillary tool of the wire bonding machine, etching bulk contaminants over one or more locations of a semiconductor device with the capillary tool, and applying plasma to the semiconductor device to remove residual contaminants.

In some embodiments, etching bulk contaminants includes moving the capillary tool in a reciprocating motion. In some embodiments, etching bulk contaminants includes moving the capillary tool in a circular motion.

In some embodiments, configuring the wire bonding machine includes configuring the capillary to remain above the surface of the semiconductor device.

In some embodiments, the semiconductor device includes a die and a lead frame package.

In some embodiments, the one or more locations include a lead frame finger of the package. In some embodiments, the one or more locations include a bond pad of the die.

In some embodiments, the method further includes etching remaining contaminants over one or more locations of the semiconductor device after the application of plasma and re-applying plasma to the semiconductor device to remove residual contaminants.

In some embodiments, configuring the wire bonding machine includes configuring the speed of movement of the capillary.

In some embodiments, etching the bulk contaminants includes performing micro movements and macro movements with the capillary tool.

In some embodiments, the bulk contaminants include organic material. In some embodiments, the bulk contaminants include inorganic material.

In some embodiments, the method further includes determining that the semiconductor device includes a wire-bonded die with one or more bond failures and removing one or more wire-bonds of the wire-bonded die before etching the bulk contaminants.

In accordance with some implementations, the present disclosure relates to a system for performing a semiconductor processing operation including a semiconductor device and a wire-bonding machine with a capillary tool, the wire-bonding machine configured to etch bulk contamination at one or more locations on the semiconductor device with the capillary tool, followed by application of plasma to the semiconductor device to remove residual contamination.

In some embodiments, the wire-bonding machine is additionally configured to move the capillary tool in a reciprocating motion to etch the bulk contamination. In some embodiments, the wire-bonding machine is additionally configured to move the capillary tool in a circular motion to etch the bulk contamination.

In some embodiments, the wire-bonding machine is additionally configured to keep the capillary above the surface of the semiconductor device to etch the bulk contamination.

In some embodiments, the semiconductor device includes a die and a lead frame package.

In some embodiments, the one or more locations include a lead frame finger of the package. In some embodiments, the one or more locations include a bond pad of the die.

In some embodiments, the wire-bonding machine is additionally configured to etch remaining contaminants over one or more locations of the semiconductor device after the application of plasma and to re-apply plasma to the semiconductor device to remove residual contaminants.

In some embodiments, the speed of movement of the capillary of the wire-bonding machine during an etching action is additionally configured.

In some embodiments, the capillary of the wire-bonding machine is additionally configured to perform micro movements and macro movements while etching.

In some embodiments, the bulk contaminants include organic material. In some embodiments, the bulk contaminants include inorganic material.

In some embodiments, the semiconductor device of the system includes a wire-bonded die with one or more bond failures and one or more wire-bonds of the wire-bonded die have been removed.

In some embodiments, the present disclosure includes a wire-bonding machine with a capillary tool, the wire-bonding machine configured to etch bulk contamination at one or more locations on a semiconductor device with the capillary tool, followed by application of plasma to the semiconductor device to remove residual contamination.

In some embodiments, the wire-bonding machine is further configured to move the capillary tool in a reciprocating motion to etch the bulk contamination. In some embodiments, the wire-bonding machine is further configured to move the capillary tool in a circular motion to etch the bulk contamination.

In some embodiments, the wire-bonding machine is further configured to keep the capillary above the surface of the semiconductor device to etch the bulk contamination.

In some embodiments, the wire-bonding machine is further configured to etch remaining contaminants over one or more locations of the semiconductor device after the application of plasma and to re-apply plasma to the semiconductor device to remove residual contaminants.

In some embodiments, the speed of movement of the capillary of the wire-bonding machine during an etching action is additionally configured. In some embodiments, the capillary of the wire-bonding machine is additionally configured to perform micro movements and macro movements while etching.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed are methods, materials, devices, systems and the like, for cleaning and recovering contaminated wire bonded semiconductor devices, and cleaning semiconductor devices before wire bonding. Although described in the context of wire bond technology, it will be understood that one or more features of the present disclosure can also provide cleaning and recovery for other electronic devices.

There are many causes for bonding failures of semiconductor die to packages, boards or modules. These causes include wear-out of bonding tools, oxidation of the bonding wires or bonding materials, and contamination of bonding sites on the die, package or module.

One source of contamination typically seen on failed semiconductor parts includes conductive and non-conductive epoxy bleeding on printed circuit board (PCB) leads or die bond pads during the die attach process. Another source of contamination is solder splashing on PCB leads during surface-mount technology (SMT) processes. Various semiconductor and board processes result in "staining" of PCB leads (e.g., from flux), or oxidation of the metal of PCB leads.

In some cases, semiconductor devices with poorly bonded die are scrapped and a large financial loss is incurred. As a result, there is a need for a reliable and effective technique to remove contamination that is difficult to remove with conventional approaches. It is one aspect of this disclosure to improve the yield of successfully bonded semiconductor devices, another to reduce the mean-time-between-assist (MTBA) metric of a wire-bond machine, and another to manufacture semiconductor devices with stronger wire-bonds due to a reduction in device contamination.

Figure 1A:
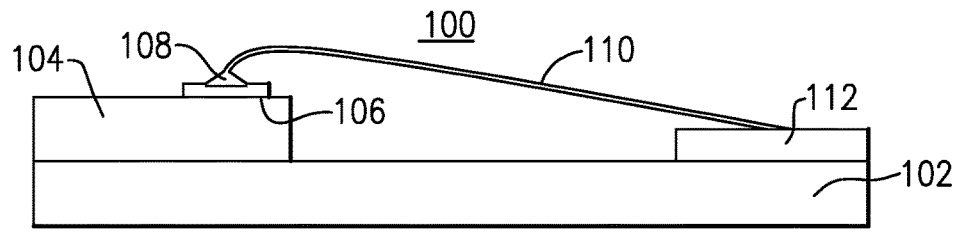
FIG. 1A illustrates a cross-sectional view of a standard wire-bond connection without a perceived failure.

FIGS. 1A to 1E provide a visual comparison of a few different types of failure modes for wire-bonded parts. FIG. 1A illustrates a cross-sectional view 100 of a standard wire-bond connection without a perceived failure. In FIG. 1A, a bond pad 106, is attached to a die 104. A metal deposit 108 is attached to bond pad 106, and is a part of wire 110. Wire 110 is properly bonded to metallization 112 on substrate 102. In some embodiments, metallization 112 is a part of a lead frame (e.g., lead frame finger) or another die package component. In some embodiments, FIGS. 1A-1E each illustrate an example of a wire-bond connection after performance of a "pull test" on the connection. For example, the connection between bond pad 106 and metallization 112 is tested by pulling on wire 110 in an upward direction.

Wire bonding is an electrical interconnection technique using thin metallic wires and a combination of heat, pressure and/or ultrasonic energy. Wire-bonding is a solid phase welding process, where two metallic materials (e.g., wire and pad surface or wire and PCB lead surface) are brought into contact. Ideally, once the surfaces are in contact, electron sharing or inter diffusion of atoms takes place, resulting in the formation of a wire bond.

Figure 1B:
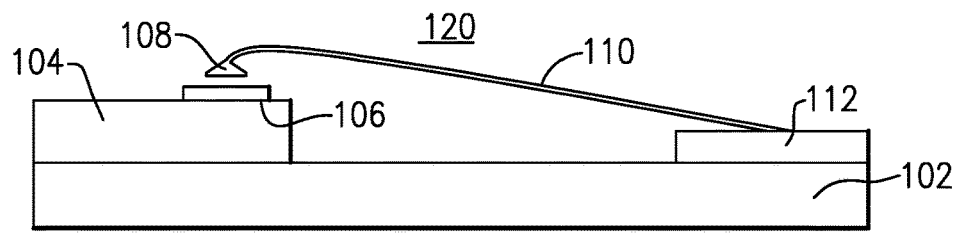
FIG. 1B illustrates a cross-sectional view of a first type of failed wire-bond connection.

FIG. 1B illustrates a cross-sectional view 120 of one type of failed wire-bond connection. Here, metal deposit 108 has detached from bond pad 106, after the performance of a stress test (e.g., a pull test on wire 110). In some embodiments, metal deposit 108 lifts off from bond pad 106 due to poor bonding technique (e.g., bad placement of metal deposit 108, not enough pressure or heat applied to metal deposit 108). In some embodiments, this wire-bonding failure occurs due to a poor selection of interfacing metals (e.g., the metal of bond-pad 106 and the metal of deposit 108 do not meld well together). However, in some embodiments, metal deposit 108 lifts off from bond pad 106 due to poor surface conditions on bond pad 106. For example, bond pad 106 has a rough surface, preventing the formation of a good bond between bond pad 106 and metal deposit 108. In another example, bond pad 106 has contamination on its surface, and some or all of metal deposit 108 makes contact with that contamination. As a result of metal deposit 108 making contact with the contamination, it is easy to pull metal deposit 108 off of bond pad 106 since the contamination-to-pad and contamination-to-deposit connections are each relatively weak.

Figure 1C:
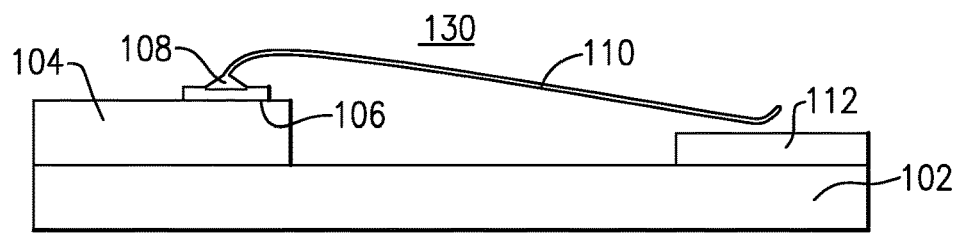
FIG. 1C illustrates a cross-sectional view of a second type of failed wire-bond connection.

FIG. 1C illustrates a cross-sectional view 130 of another type of failed wire-bond connection. In some embodiments, a wire-bond failure occurs at the interface between wire 110 and metallization 112. Similar to the failure shown in FIG. 1B, wire 110 may lift off at the interface to metallization 112 due to poor bonding technique, poor selection of interfacing metals, or poor surface conditions at metallization 112. One source of poor surface conditions at metallization 112, is a build-up of contamination.

In some embodiments, contamination at any bonding surface of a package (including bond pad 106 or metallization 112) consists of organic and/or inorganic material. For example, the contamination is a deposit of epoxy that has spilled over from another region, over the bonding surface. In another example, metal fragments contaminate a bonding surface, resulting in an uneven location for wire-bonding, and sites with poor surface connectivity. In some embodiments, metal contamination occurs from metal splash resulting from neighboring bonded sites. For example, a bond pad adjacent to bond pad 106 was formed with excessive pressure, causing some metal of that bond pad to "splash" onto bond pad 106. This example illustrates that semiconductor devices with bad initial contamination can result in additional contamination problems if dealt with incorrectly. For example, if it is observed that a batch of semiconductor devices are routinely failing wire-bond pull tests, one approach to fixing this problem is to increase wire-bond application pressure, inadvertently creating another source of contamination.

Figure 1D:
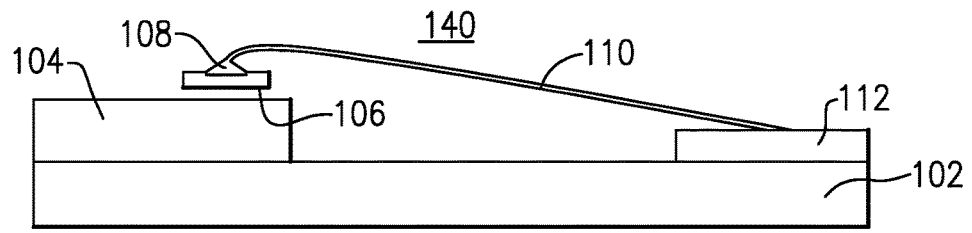
FIG. 1D illustrates a cross-sectional view of a third type of failed wire-bond connection.
Figure 1E:
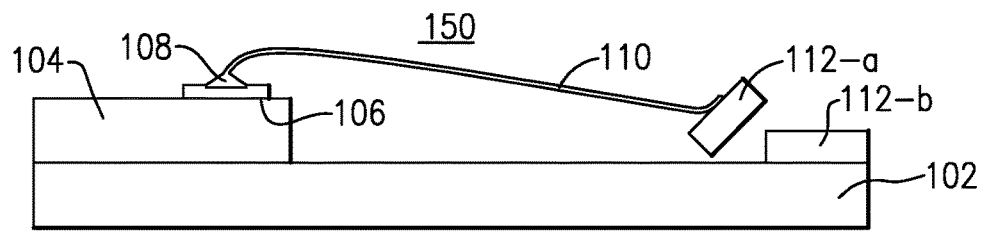
FIG. 1E illustrates a cross-sectional view of a fourth type of failed wire-bond connection.

FIG. 1D illustrates a cross-sectional view 140 of another type of failed wire-bond connection. In some embodiments, bond pad 106 lifts off of die 104 during a stress test such as a wire-bond pull test. In some embodiments, this type of failure is a result of cracking underneath a bonded bond pad, due to excessive wire-bonding application pressure. FIG. 1E illustrates a cross-sectional view 150 of another type of failed wire-bond connection. In FIG. 1E, the failure occurs at metallization 112, which fractures and breaks into metallization 112-a and metallization 112-b, under a stress test of the wire-bond. This may also be caused by excessive wire-bond application pressure at the interface between wire 110 and metallization 112-a, and a resulting fracture in one or more areas around the interface. As described earlier, increased bonding pressure is one approach taken after observing several failed wire-bond stress tested parts.

Figure 2A:
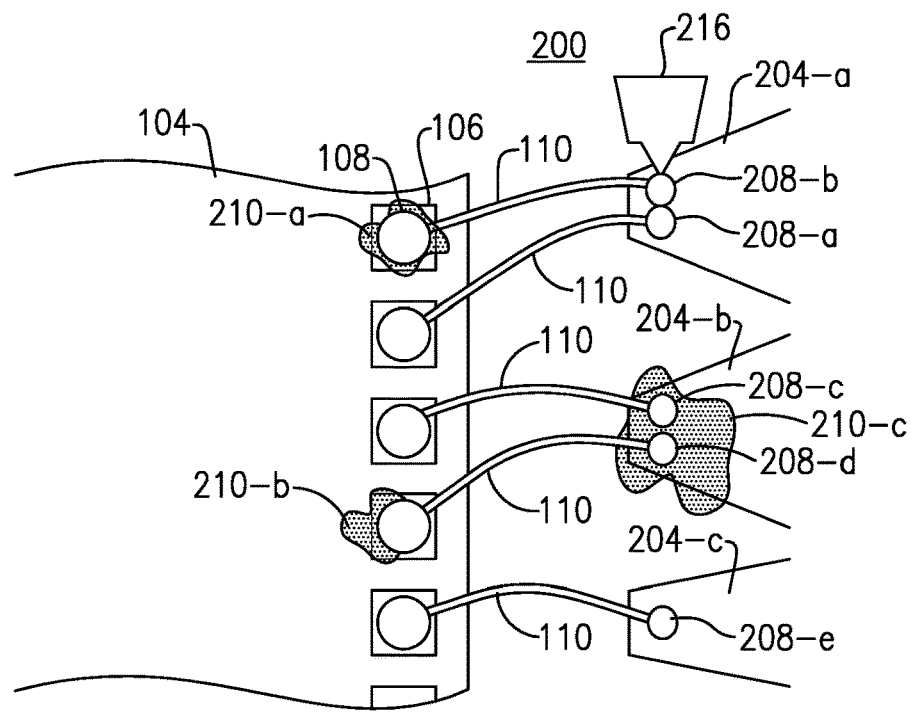
FIG. 2A provides a top-down view of a section of wire-bonding between a die and lead-frame fingers.

FIG. 2A provides a top-down view 200 of a section of wire-bonding between die 104 and lead-frame fingers 204-a, 204-b and 204-c. In top-down view 200, five adjacent bond pads 106 of die 104 are shown with wire-bonds 110 to locations on a lead frame package 204 (e.g., finger 204-a, finger 204-b, and/or finger 204-c). As shown earlier in FIGS. 1A-1E, a metal deposit 108 is located on each bond pad 106 that is wire-bonded, with wire 110 to a respective bond site 208 at a respective location on lead frame package 204. FIG. 2A also shows capillary 216 of a wire-bonding machine or tool. A capillary 216 is a specialized tool for depositing metal to create wire bonds, through a hollowed-out tip. In this example, capillary 216 just finished creating a wire-bond from a bond pad 106 to bond site 208-a on lead frame package finger 204-a.

FIG. 2A also illustrates several examples of contamination on regions of die 104 and lead frame package 204. For example, contamination 210-a is located over a bond pad 106, which likely created a weak connection between bond pad 106 and metal deposit 108 during the formation of a wire-bond. Additionally, in the examples of FIG. 2, there is contamination 210-b on a portion of another bond pad, and contamination 210-c on a portion of lead frame package finger 204-b interfering with the formation of additional wire-bond connections. As mentioned earlier, these contaminations may include organic or inorganic material, such as dust, hair, skin cells, metal fragments, epoxy, adhesives, oxides or moisture.

Figure 2B:
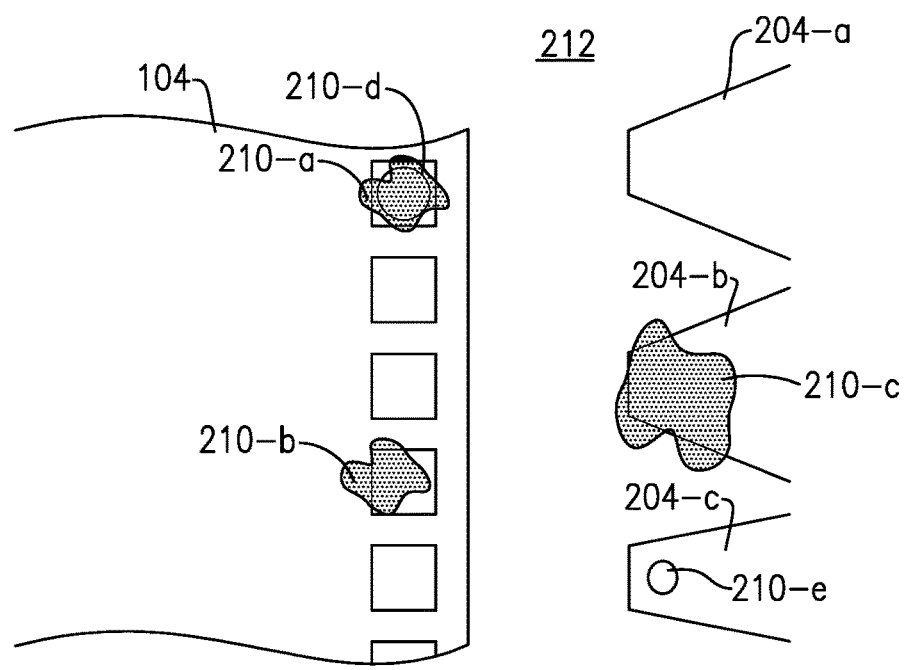
FIG. 2B provides a top-down view of the same section of the die and lead-frame fingers shown in FIG. 2A, with the wire-bonds removed.

FIG. 2B provides a top-down view 212 of the same section of die 104 and lead-frame fingers 204-a, 204-b and 204-c shown in FIG. 2A, with the wire-bonds removed. Typically, if a wire-bonded semiconductor part performs poorly in a stress test such as a pull test, the part is scrapped and written off as a cost of doing business. The wire-bonds of the contaminated device shown in FIG. 2A would likely fail such a stress test, causing the device to be scrapped, despite other components of the semiconductor device still having value. One aspect of this disclosure is to recover that lost value by cleaning and re-bonding semiconductor devices that fail wire-bond stress tests. FIG. 2B illustrates one stage of recovery involving the removal of one or more wire-bonds of the semiconductor device that failed the stress test. In some embodiments only the failed wire-bonds are removed, while in some embodiments all the wire-bonds, or all the wire-bonds in a highly contaminated region are removed. For example, as shown in FIG. 2B, the region in view 212 is highly contaminated, and the five pre-existing wire-bonds have been removed.

FIG. 2B also illustrates that in some embodiments, the removal of wire-bonds creates new sources of contamination. For example, contamination 210-d is metallic residue from removing metal deposit on 108, and contamination 210-e is similarly metallic residue left behind from removal of metal at bond site 208-e.

Figure 3A:
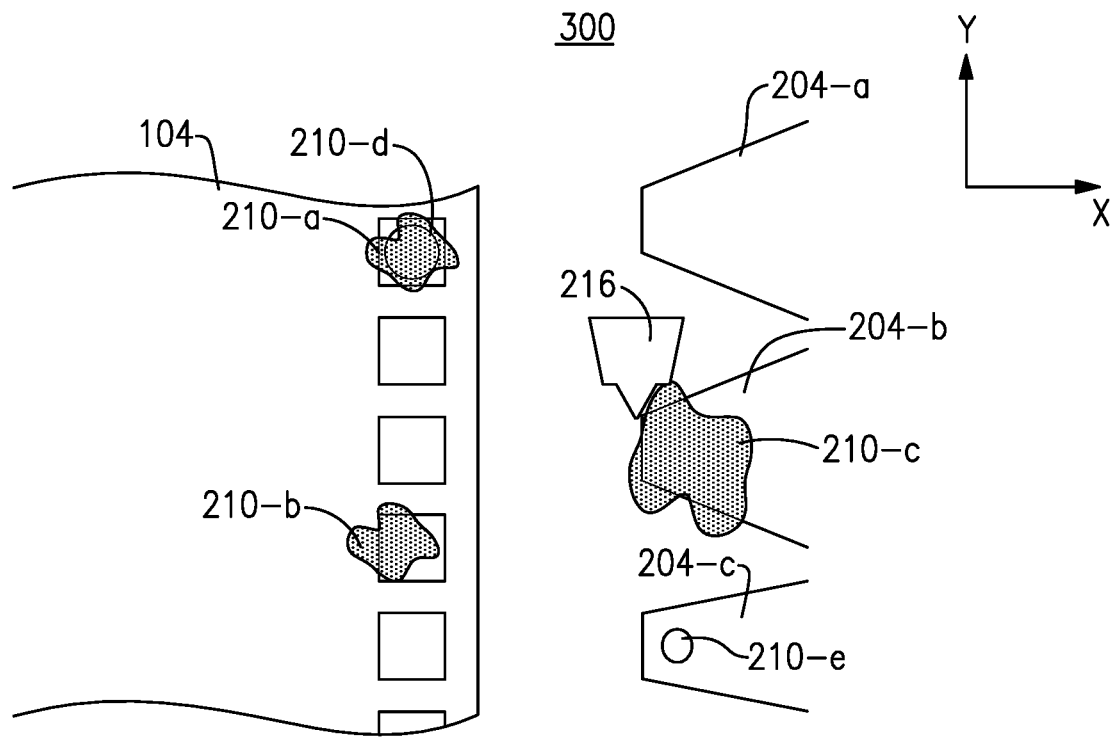
FIG. 3A provides a top-down view of the same section of the die and lead-frame fingers shown in FIGS. 2A and 2B, while undergoing contamination removal treatment.
Figure 3B:
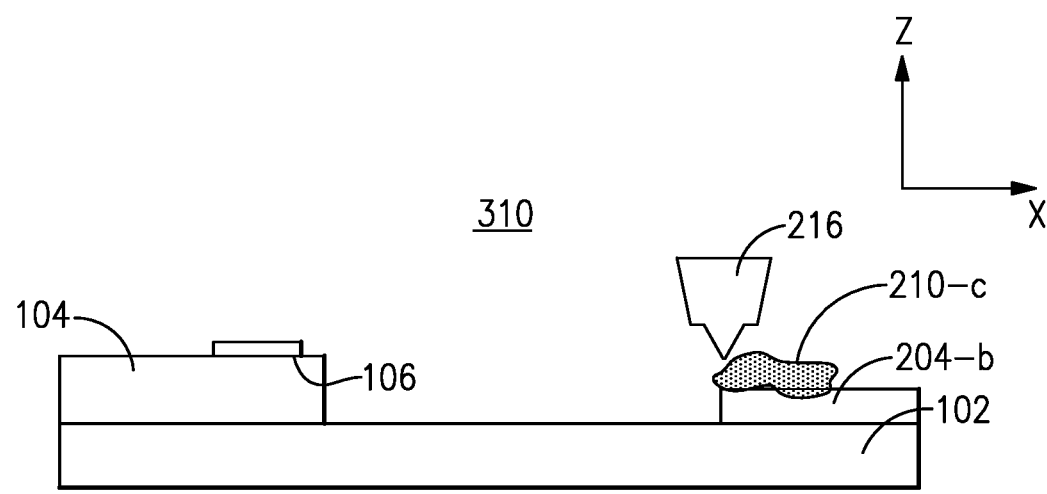
FIG. 3B provides a side cross-sectional view of the same section of the die and lead-frame fingers shown in FIG. 3A, while undergoing contamination removal treatment.

FIG. 3A provides a top-down view 300 of the same section of die 104 and lead-frame fingers 204-a, 204-b and 204-c, while undergoing contamination removal treatment, and FIG. 3B provides a side cross-sectional view 310 of the same section. The example shown in FIG. 3A and FIG. 3B involves removal of some or all of a bulky contaminant (e.g., contamination 210-c) through an etching action involving capillary 216, the same tool shown in FIG. 2A for wire-bonding. FIG. 3A and FIG. 3B illustrate one aspect of this disclosure involving calibration and programming of capillary 216 to perform this customized action. In some embodiments, capillary 216 moves in a lateral (e.g., side-to-side in an x-y plane) motion, or circular motion (e.g., in an x-y plane), a zig-zag motion, or some combination of motions. For example, to perform a "scrubbing" action, capillary 216 may combine small circular movements or reciprocating movements in an overall lateral, side-to-side motion to traverse the entire contaminated region.

Calibration and programming of capillary 216 to perform this specialized cleaning operation requires the use of various parameters, such as the starting position of capillary 216 relative to a coordinate system, and/or relative to the surface of the semiconductor device. For example, the surface of one corner of die 104 is considered the origin of an x-y-z coordinate system, and all movement of capillary 216 is performed relative to that location. Location-based parameters are used to determine a pattern of motion for capillary 216, such that capillary 216 etches away at bulky contamination sites with its tip. These location-based parameters include, or are used in connection with, pattern-based parameters governing the movement of capillary 216. For example, pattern-based parameters define minute circular motions, quick back-and-forth vibrational motions or short-distance "chipping" motions in the z-axis. These patterns may be used with location-based parameters to combine relatively micro-scale movements with macro-scale movements to effectively etch away at contaminants. In some embodiments, these patterns and/or location-based parameters are determined in part by manual calibration on one or more semiconductor devices. In some embodiments, cleaning or etching is performed in an automated mode for one or more semiconductor devices. In some embodiments, cleaning or etching is performed in an automated mode for one or more semiconductor devices, after manual calibration of the capillary and/or wire-bonding machine. For example, a user adjusts the height of a capillary of a wire-bonding machine over a semiconductor device while performing one or more etching motions, to ensure that the capillary does not touch the surface of the device. After this manual calibration of the height of the capillary, a series of the same semiconductor device are automatically cleaned by the wire-bonding machine.

In some embodiments, capillary 216 and/or a wire-bonding machine attached to capillary 216, includes a sensor to detect the presence of contamination. In some embodiments, this sensor is an optical sensor to visually detect the presence of contamination, and the extent to which the contamination extends over bonding regions of a die or package of a semiconductor device. In some embodiments, a wire-bonding machine is additionally calibrated so that the capillary 216 and sensor work together to detect areas of contamination, and etch away at the contamination. In some embodiments, the sensor only detects contamination of at least a predefined size, or type (e.g., relatively large metal deposits). In some embodiments, the wire-bond machine filters out observed contaminations, which are smaller than a predefined size, or are of a specific type (e.g., small dust particles), from the etching actions of the capillary 216. In some embodiments, the capillary 216 is programmed to perform one or more etching operations over each potential site of contamination, such as a bond pad or wire-bonding finger, regardless of the presence of contamination. In some embodiments, the capillary 216 is programmed to perform one or more etching operations only over actual sites of contamination.

Figure 4A:
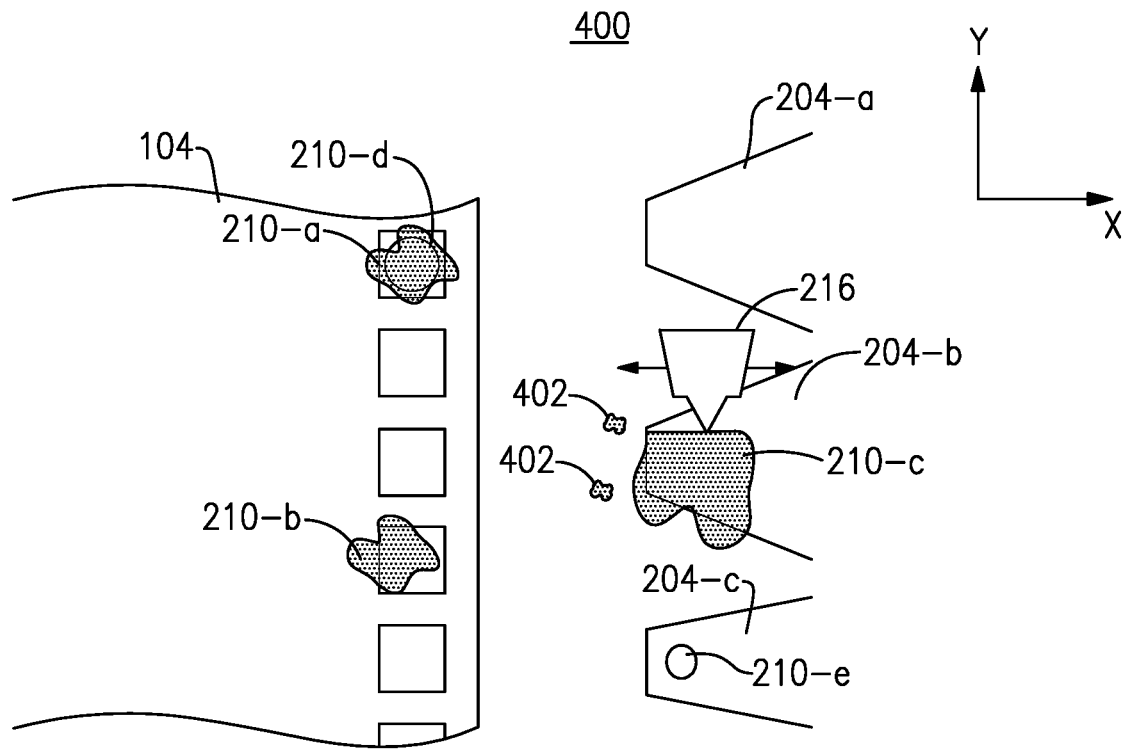
FIG. 4A provides a top-down view of the same section of the die and lead-frame fingers shown in FIGS. 2A, 2B, 3A and 3B, during an intermediate phase of contamination treatment.
Figure 4B:
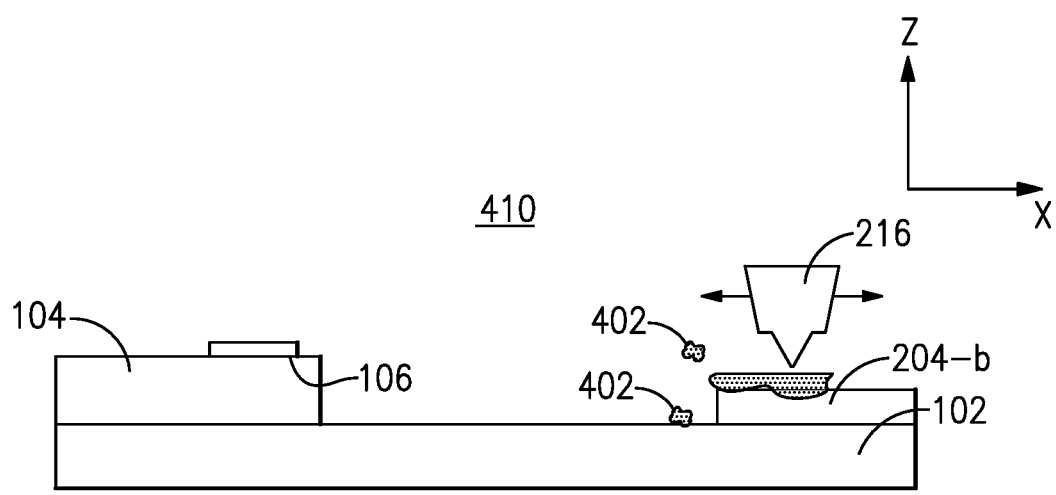
FIG. 4B provides a side cross-sectional view of the same section of the die and lead-frame fingers shown in FIG. 4A, during an intermediate phase of contamination treatment.

FIG. 4A provides a top-down view 400 of the same section of die 104 and lead-frame fingers 204-a, 204-b and 204-c, during an intermediate phase of contamination treatment, and FIG. 4B provides a side cross-sectional view 410 of the same section. FIG. 4A and FIG. 4B show that residual contamination material 402 is released after performing an etching action on contaminant 210-c. In some embodiments, some residual contamination material sticks to capillary 216, while in some embodiments residual contamination material remains on the surface of some part of the semiconductor device (e.g., material 402 resting on substrate 102). In some embodiments, residual contamination material 402 is much smaller and adhered to a much lesser degree to regions of the semiconductor device.

FIG. 4B illustrates the importance of calibrating capillary 216 not to etch down too low, to avoid damaging regions of the semiconductor device. In some embodiments, capillary 216 frequently moves up and down (relative to the surface of the semiconductor device), as it etches material away, due to an uneven surface of contamination, uneven composition of contamination and/or uneven adhesion of contamination to the semiconductor device.

Figure 5A:
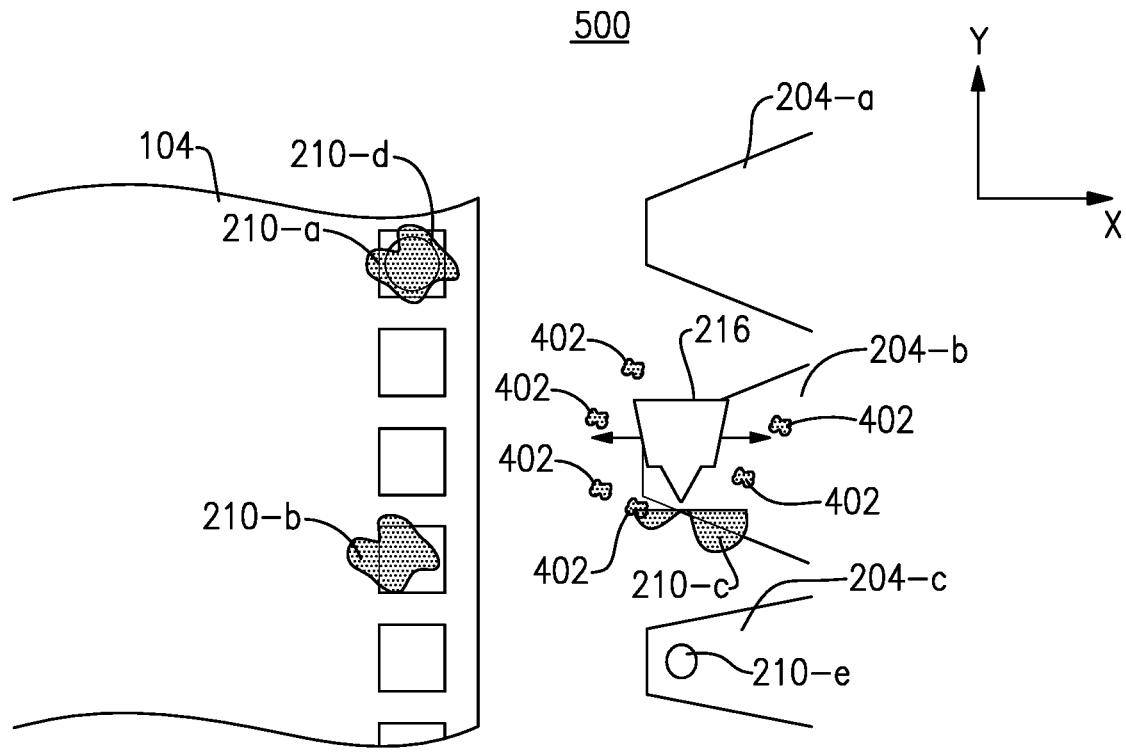
FIG. 5A provides a top-down view of the same section of the die and lead-frame fingers shown in FIGS. 2A, 2B, 3A, 3B, 4A and 4B, during an intermediate phase of contamination removal.
Figure 5B:
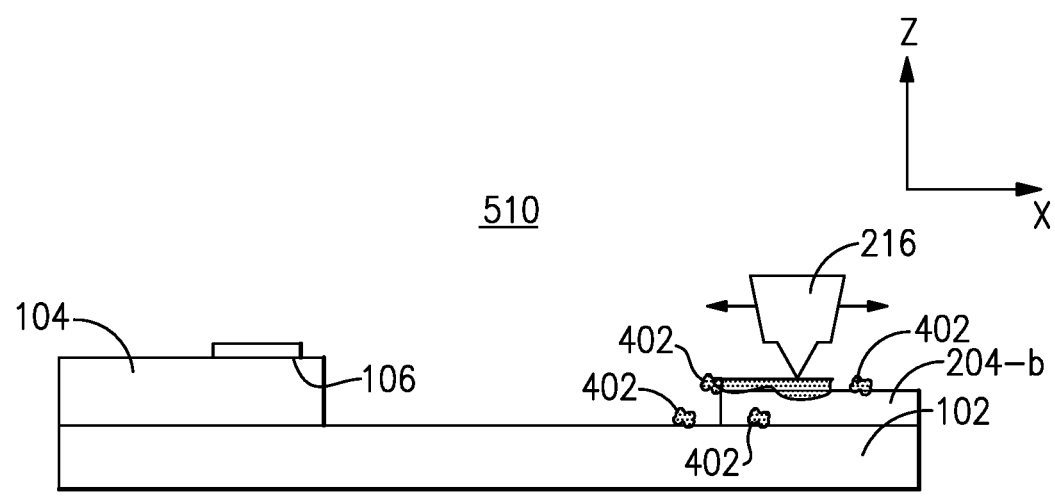
FIG. 5B provides a side cross-sectional view of the same section of the die and lead-frame fingers shown in FIG. 5A, during an intermediate phase of contamination removal.

FIG. 5A provides a top-down view 500 of the same section of die 104 and lead-frame fingers 204-a, 204-b and 204-c, during an intermediate phase of contamination removal, and FIG. 5B provides a side cross-sectional view 510 of the same section. FIG. 5A illustrates that in some embodiments, capillary 216 is used only to etch away the contamination over a region of the semiconductor device that will be used for wire-bonding (e.g., a bond pad 106 or a part of lead frame finger 204-b). For example, contamination resting on substrate 102 is not removed. In some embodiments, knowledge of the type of contaminant is used to perform the etching or cleaning action. For example, greater etching pressure is applied for the removal of hard materials such as certain metals, while less pressure is applied for the removal of brittle or soft materials. In some embodiments, the etching pressure is determined by the speed of certain movements of capillary 216. In some embodiments, the etching pressure is determined by the speed of micro movements of capillary 216, such as the frequency of side-to-side vibration, up-and-down chipping or rotational speed of small circular motions.

Figure 6A:
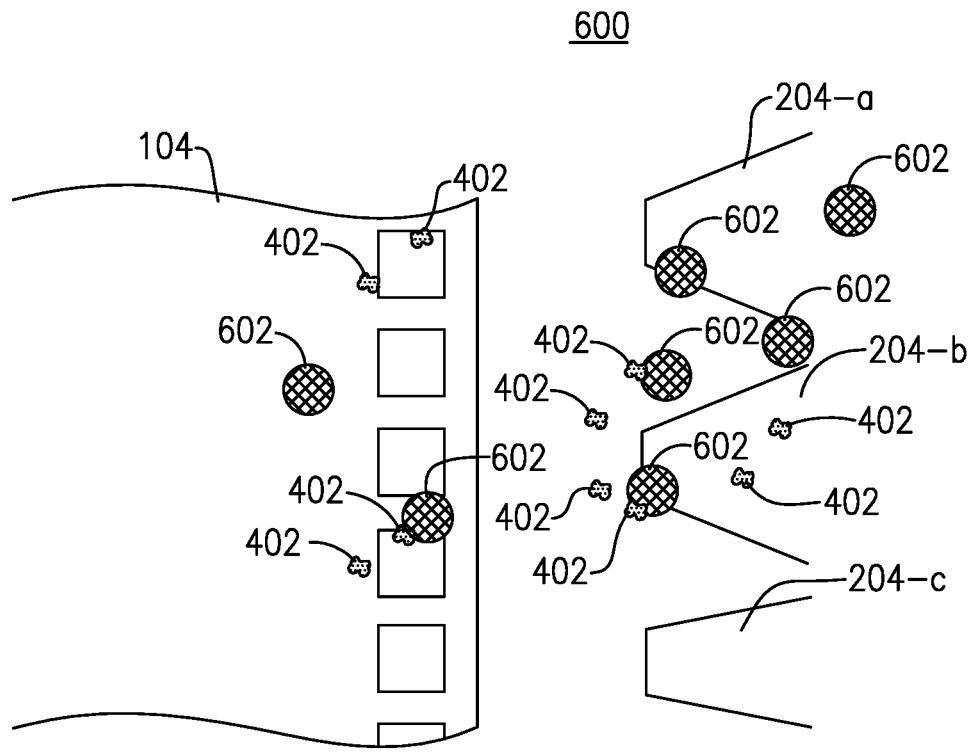
FIG. 6A provides a top-down view of the same section of the die and lead-frame fingers shown in FIGS. 2A, 2B, 3A, 3B, 4A, 4B, 5A and 5B, during a plasma application phase of contamination treatment.
Figure 6B:
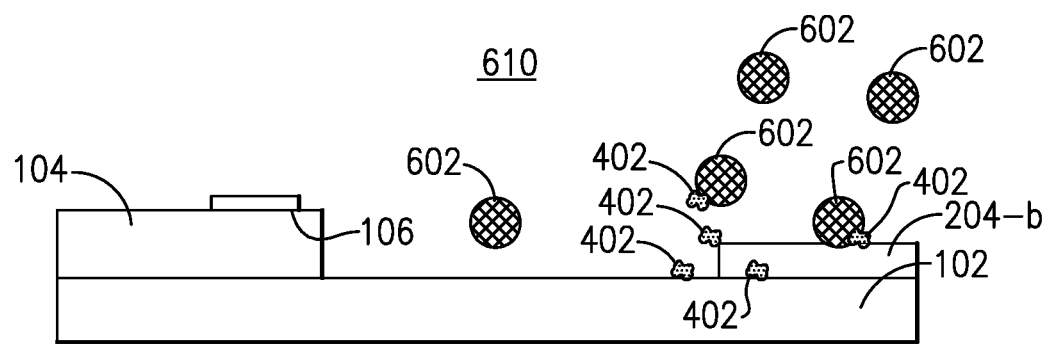
FIG. 6B provides a side cross-sectional view of the same section of the die and lead-frame fingers shown in FIG. 6A, during a plasma application phase of contamination treatment.

FIG. 6A provides a top-down view 600 of the same section of die 104 and lead-frame fingers 204-a, 204-b and 204-c, during a plasma application phase of contamination treatment, and FIG. 6B provides a side cross-sectional view 610 of the same section. In some embodiments, after capillary 216 has etched at some or all of the bulk contaminants on the semiconductor device, plasma particles 602 are applied to the semiconductor device to remove residual contamination material 402.

Plasma is formed by ionizing certain gases to create charged particles. In some embodiments, the plasma cleaning phase is performed in a plasma chamber with a vacuum pump to extract contaminants. The plasma particles bond to contaminants, and in some cases, break molecules of contaminants apart. In some embodiments, a mixture of various gases is used in the plasma chamber to extract organic and inorganic materials. FIG. 6A and FIG. 6B illustrate exemplary plasma particles 602 bonding to at least some contamination particles 402, to be eventually vacuumed out of the plasma chamber.

Figure 7:
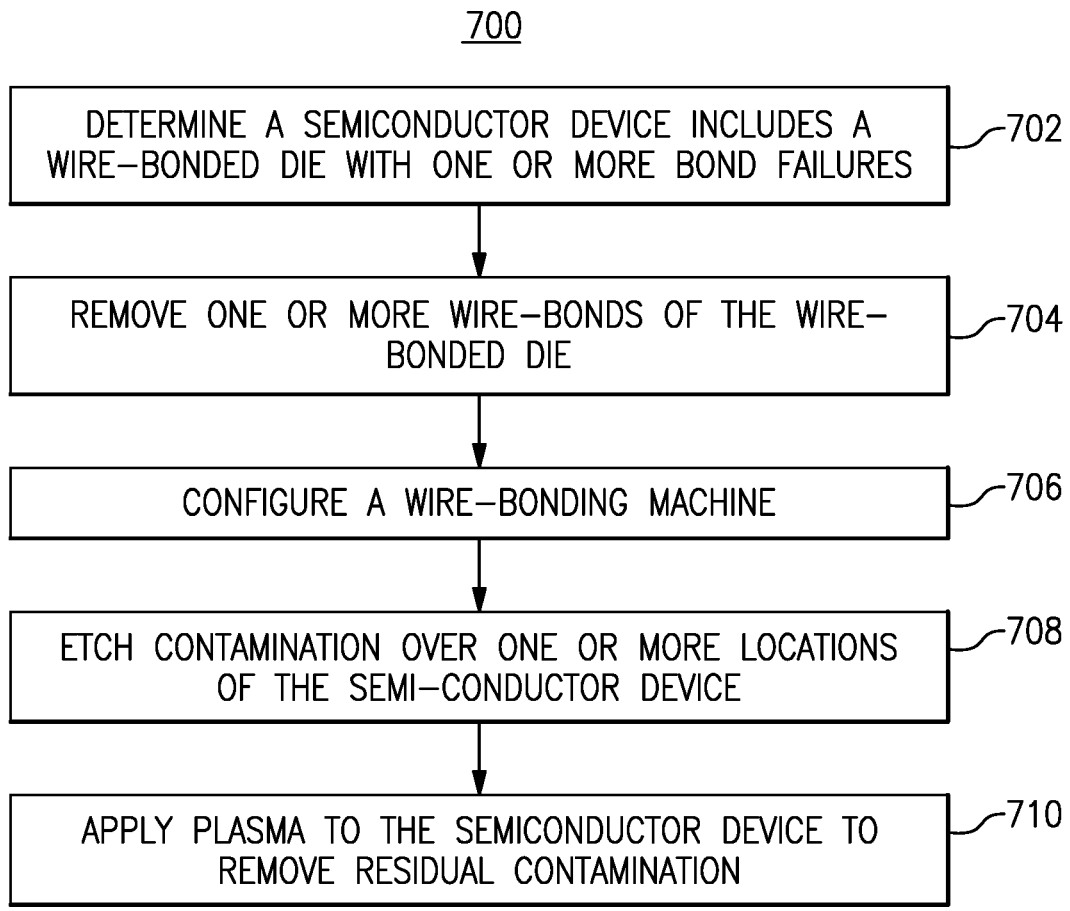
FIG. 7 illustrates a process of cleaning and recovering wire-bonded parts, in accordance with some embodiments.

FIG. 7 illustrates a flowchart representation of a method 700 of cleaning and recovering wire-bonded parts, at a system including at least a wire-bonding machine and a contaminated semiconductor device. In some embodiments, a single semiconductor-processing system includes one or more machines for various actions such as wire-bonding semiconductor devices, stress-testing wire-bonds, de-bonding existing wire-bonds, etching away contamination and performing plasma cleaning.

In some embodiments, method 700 includes determining (702) that a semiconductor device includes a wire-bonded die with one or more bond failures. In some embodiments, this determination is made after performing one or more stress tests, such as a "pull" test on bond wires. In some embodiments, the semiconductor-processing system receives known failed parts, therefore the determination merely includes identifying receipt of a failed part.

In some embodiments, method 700 includes removing (704) one or more wire-bonds of the wire-bonded die. In some embodiments this includes actions such as de-soldering, heating, clipping, shearing, and/or chemical immersion to remove the bonded wires from a die and package frame. In some embodiments, the system receives semiconductor devices before any wire-bonding has been performed on any mounted semiconductor die.

Method 700 includes configuring (706) a wire-bonding machine to perform specialized cleaning operations using a capillary tool of the wire-bonding machine (e.g., capillary 216, FIG. 2A). In some embodiments, the same wire-bonding machine was used to form the original wire-bonds that were removed. That is to say, in some embodiments, the wire-bonding machine is configured to perform wire-bonding, and one or more cleaning actions. In some embodiments, configuring the wire-bonding machine includes configuring one or more micro movements of the capillary tool, and/or one or more macro movements of the capillary tool. For example, configuring the wire-bonding machine includes configuring the capillary tool to make small circular motions, while moving laterally across a region of contamination (e.g., in an x-y plane relative to the surface of the semiconductor device). In another example, configuring the wire-bonding machine includes configuring the capillary tool to make small up-and-down bobbing motions, while moving the capillary tool in a spiral motion across a region of contamination (e.g., spiraling inward from a large surrounding circle). In some embodiments, configuring the wire-bonding machine includes setting an intensity or pressure of etching, which in some embodiments is associated with a speed of micro and/or macro movements of the capillary. In some embodiments, configuring the wire-bonding machine includes manual calibration of one or more cleaning or etching parameters for one or more semiconductor devices.

Method 700 includes etching (708) contamination over one or more locations of the semiconductor device, using a capillary tool of a wire-bonding machine. In some embodiments, etching the contamination includes detecting contaminated regions on the bonding sites (e.g., bond pads or metallization) of the semiconductor device. In some embodiments, detection of contamination and subsequent etching of the contamination is performed automatically by the configured wire-bonding machine. In some embodiments the configured wire-bonding machine has a sensor to detect contaminated regions, which is used to detect and etch away the contamination. In some embodiments, a different capillary tool is used by the wire-bonding machine for etching rather than wire bonding. In some embodiments, etching the contamination includes manual operation of the wire-bonding machine and/or capillary by a user. In some embodiments, etching the contamination includes automatic operation of the wire-bonding machine and/or capillary.

Method 700 includes applying (710) plasma to the semiconductor device to remove residual contamination after etching the contaminations with the capillary tool. In some embodiments, the plasma application is performed in a plasma chamber of the semiconductor processing system. The application of plasma may include application of one or more distinct gases, such as $O_2$, $N_2$, Ar, $H_2$, and $CF_4$. In some embodiments, the etching of bulk contaminants and application of plasma are each repeated one or more times, to remove contaminants that did not get adequately removed after the first pass of these cleaning actions.

For the purpose of description, it will be understood that the above-mentioned die can include, for example, silicon (Si), gallium arsenide (GaAs), and silicon germanium (SiGe). Other types of semiconductor die can also be utilized.

In some implementations, a device (e.g., a partially-processed semiconductor device) having one or more features described herein can be included in an RF device such as a wireless device. Such a semiconductor device can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for performing a semiconductor processing operation, comprising:
configuring a wire bonding machine such that the wire bonding machine performs customized cleaning movements with a capillary tool of the wire bonding machine, the configuring the wire bonding machine including configuring the capillary tool based on location-based parameters and pattern-based parameters relating to performing the customized cleaning movements, the pattern-based parameters defining one or more movements to etch contaminants with the capillary tool;
detecting one or more locations of a semiconductor device including the contaminants;
filtering out detected contaminants that are less than a predetermined size; and
etching the contaminants of at least the predetermined size over the one or more locations of the semiconductor device with the capillary tool, an etching pressure based on a speed of the customized cleaning movements of the capillary tool and a type of the contaminant.

2. The method of claim 1 further comprising applying plasma to the semiconductor device to remove residual contaminants remaining subsequent to the etching.

3. The method of claim 2 wherein applying the plasma includes applying one or more of $O_2$, $N_2$, Ar, $H_2$, or $CF_4$.

4. The method of claim 2 wherein the plasma is applied in a plasma chamber.

5. The method of claim 2 wherein the plasma includes a mixture of gases to extract organic and inorganic material.

6. The method of claim 2 further comprising:
etching contaminants over one or more locations of the semiconductor device remaining after applying the plasma; and
re-applying plasma to the semiconductor device to remove contaminants remaining subsequent to the etching the contaminants over the one or more locations of the semiconductor device remaining after applying the plasma.

7. The method of claim 1 wherein the etching includes moving the capillary tool in a reciprocating motion.

8. The method of claim 1 wherein the etching includes moving the capillary tool in a circular motion.

9. The method of claim 1 wherein the configuring the wire bonding machine includes configuring the capillary tool such that the capillary tool remains above a surface of the semiconductor device.

10. The method of claim 1 wherein the semiconductor device includes a die and a lead frame package.

11. The method of claim 10 wherein the one or more locations include a lead frame finger of the lead frame package.

12. The method of claim 10 wherein the one or more locations include a bond pad of the die.

13. The method of claim 1 further comprising setting the speed of movement of the capillary tool during an etching action.

14. The method of claim 1 wherein etching the contaminants includes performing micro movements and macro movements with the capillary tool.

15. The method of claim 1 wherein the contaminants include organic material.

16. The method of claim 1 wherein the contaminants include inorganic material.

17. The method of claim 1 further comprising:
determining that the semiconductor device includes a wire-bonded die with one or more bond failures; and
removing one or more wire bonds of the wire-bonded die before the etching.

18. The method of claim 1 wherein the one or more locations include a location from which a wire bond is removed.

19. The method of claim 1 wherein detecting the one or more locations of the semiconductor device including the contaminants includes using a sensor to detect the one or more locations.

20. The method of claim 19 wherein the sensor is an optical sensor.

* * * * *